(12) United States Patent
Kalifa et al.

(10) Patent No.: US 11,362,486 B2
(45) Date of Patent: Jun. 14, 2022

(54) HIGH SPEED HIGH BANDWIDTH VERTICAL-CAVITY SURFACE-EMITTING LASER WITH CONTROLLED OVERSHOOT

(71) Applicant: Mellanox Technologies, Ltd., Yokneam (IL)

(72) Inventors: Itshak Kalifa, Ramat Gan (IL); Elad Mentovich, Tel Aviv (IL)

(73) Assignee: Mellanox Technologies, Ltd., Yokneam (IL)

(*) Notice: Subject to any disclaimer, the term of this patent is extended or adjusted under 35 U.S.C. 154(b) by 0 days.

(21) Appl. No.: 16/589,534

(22) Filed: Oct. 1, 2019

(65) Prior Publication Data

US 2020/0358253 A1     Nov. 12, 2020

Related U.S. Application Data

(63) Continuation-in-part of application No. 16/404,244, filed on May 6, 2019, now Pat. No. 11,165,222.

(51) Int. Cl.
*H01S 5/183*     (2006.01)

(52) U.S. Cl.
CPC ...... *H01S 5/18347* (2013.01); *H01S 5/18313* (2013.01); *H01S 5/18327* (2013.01);
(Continued)

(58) Field of Classification Search
CPC ............. H01S 5/18394; H01S 5/18327; H01S 5/18361–1838; H01S 5/18344–18352; H01S 5/183–18397; H01S 5/42–426
See application file for complete search history.

(56) References Cited

U.S. PATENT DOCUMENTS

| | | | |
|---|---|---|---|
| 5,963,576 A | * | 10/1999 | Claisse ............... H01S 5/18391 372/45.01 |
| 6,084,900 A | * | 7/2000 | Claisse ................. H01S 5/423 372/23 |

(Continued)

OTHER PUBLICATIONS

United States Patent and Trademark Office, Final Office Action for U.S. Appl. No. 16/404,244, dated Jul. 16, 2020, (24 pages), U.S.

(Continued)

*Primary Examiner* — Tod T Van Roy
*Assistant Examiner* — Delma R Fordé
(74) *Attorney, Agent, or Firm* — Alston & Bird LLP (57) ABSTRACT

A vertical-cavity surface-emitting laser (VCSEL) is provided. The VCSEL includes a mesa structure disposed on a substrate. The mesa structure includes a first reflector, a second reflector, and an active cavity material structure disposed between the first and second reflectors. The second reflector has an opening extending from a second surface of the second reflector into the second reflector by a predetermined depth. Etching into the second reflector to the predetermined depth reduces the photon lifetime and the threshold gain of the VCSEL, while increasing the modulation bandwidth and maintaining the high reflectivity of the second reflector. Thus, etching the second reflector to the predetermined depth provides an improvement in overshoot control, broader modulation bandwidth, and faster pulsing of the VCSEL such that the VCSEL may provide a high speed, high bandwidth signal with controlled overshoot.

20 Claims, 7 Drawing Sheets

(52) U.S. Cl.
CPC ...... *H01S 5/18352* (2013.01); *H01S 5/18361* (2013.01); *H01S 5/18394* (2013.01)

(56) References Cited

U.S. PATENT DOCUMENTS

| | | | |
|---|---|---|---|
| 6,317,446 B1* | 11/2001 | Wipiejewski | H01S 5/18313 372/46.01 |
| 6,661,823 B1 | 12/2003 | Otoma et al. | |
| 7,483,465 B2 | 1/2009 | Thornton et al. | |
| 8,189,642 B1 | 5/2012 | Li et al. | |
| 8,971,372 B2 | 3/2015 | Suzuki et al. | |
| 9,716,368 B2 | 7/2017 | Padullaparthi | |
| 10,199,794 B1 | 2/2019 | Yuen | |
| 2002/0003822 A1 | 1/2002 | Wipiejewski | |
| 2002/0101894 A1 | 8/2002 | Coldren et al. | |
| 2002/0172247 A1 | 11/2002 | Sopra et al. | |
| 2004/0151221 A1 | 8/2004 | Yamamoto et al. | |
| 2005/0030993 A1* | 2/2005 | Thornton | H01S 5/18391 372/43.01 |
| 2007/0217472 A1* | 9/2007 | Collins | H01S 5/18391 372/50.124 |
| 2007/0268943 A1 | 11/2007 | Tatum | |
| 2008/0069168 A1* | 3/2008 | Kim | H01S 5/18375 372/50.23 |
| 2008/0137692 A1 | 6/2008 | Park et al. | |
| 2008/0205465 A1* | 8/2008 | Nguyen | H01S 5/18352 372/45.01 |
| 2009/0274186 A1 | 11/2009 | Mochizuki | |
| 2010/0040104 A1* | 2/2010 | Maeda | H01S 5/02461 372/50.124 |
| 2011/0135318 A1 | 6/2011 | Takeda et al. | |
| 2011/0150500 A1 | 6/2011 | Matsushita et al. | |
| 2011/0165712 A1 | 7/2011 | Uchida | |
| 2012/0134382 A1* | 5/2012 | Mayer | H01S 5/18333 372/46.013 |
| 2013/0051421 A1 | 2/2013 | Traut et al. | |
| 2014/0064315 A1 | 3/2014 | Dummer et al. | |
| 2015/0078410 A1* | 3/2015 | Padullaparthi | H01S 5/18361 372/34 |
| 2015/0380606 A1 | 12/2015 | Padullaparthi | |
| 2015/0380901 A1* | 12/2015 | Brenner | H01S 5/18333 372/45.012 |
| 2016/0064900 A1 | 3/2016 | Takeda et al. | |
| 2016/0118773 A1 | 4/2016 | Havakawa et al. | |
| 2016/0226221 A1* | 8/2016 | Kaneko | H01S 5/18313 |
| 2016/0352074 A1 | 12/2016 | Hogan et al. | |
| 2017/0005455 A1 | 1/2017 | Padullaparthi | |
| 2017/0256915 A1* | 9/2017 | Ghosh | H01S 5/0421 |
| 2018/0331491 A1 | 11/2018 | Tsuji | |
| 2018/0341076 A1* | 11/2018 | Watanabe | H01S 5/02284 |
| 2019/0067899 A1 | 2/2019 | Tsuji | |
| 2019/0067906 A1 | 2/2019 | Yuen et al. | |
| 2019/0312413 A1* | 10/2019 | Sirbu | H01S 5/3095 |
| 2020/0106242 A1* | 4/2020 | Kalifa | H01S 5/187 |
| 2020/0358247 A1* | 11/2020 | Kalifa | H01S 5/0282 |

OTHER PUBLICATIONS

Backer, A. et al. "Transverse Optical Mode Analysis of Long-Wavelength VCSEL in High Single-Mode Operation"; Proc. of 8th Int. Conf. of Numerical Simulation of Optoelectronic Devices (NUSOD); pp. 87-88; 2008.

Caliman, A. et al. "25 Gbps Direct Modulation and 10 km Data Transmission with 1310 nm Waveband Wafer Fused VCSELs"; Optics Express; vol. 24, No. 15; Jul. 25, 2016; pp. 16329-16335.

Feezell, D. et al.; "InP-Based 1.3-1.6 µm VCSELs With Selectively Etched Tunnel-Junction Apertures on a Wavelength Flexible Platform"; IEEE Photonics Technology Letters; vol. 17, No. 10; Oct. 2005; pp. 2017-2019.

Kapon, Eli et al.; "Power-Efficient Answer"; Nature Photonics; vol. 3; Jan. 2009; pp. 27-29.

Lin, Chao-Kun et al.; "High Temperature Continuous-Wave Operation of 1.3- and 1.55-µm VCSELs With InP/Air-Gap DBRs"; IEEE Journal of Selected Topics in Quantum Electronics; vol. 9, No. 5; Sep./Oct. 2003; pp. 1415-1421.

Sirbu, Alexei et al.; "Reliability of 1310 nm Wafer Fused VCSELs"; IEEE Photonics Technology Letters; vol. 25, No. 16; Aug. 15, 2013; pp. 1555-1558.

Sirbu, Alexei et al.; "Wafer-Fused Heterostructures: Application to Vertical Cavity Surface-Emitting Lasers Emitting in the 1310 nm Band"; Semiconductor Science and Technology; 26 (2011) 014016 (6pp); published Nov. 29, 2010.

Spiga, S. et al.; "Single-Mode 1.5-µm VCSEL with 22-GHz Small-Signal Bandwidth"; Proceedings of the European VCSEL day—2016; Darmstadt; Jun. 3, 2016; 3 pages.

Spiga, S. et al.; "Single-Mode 1.5-µm VCSELs with Small-Signal Bandwidth Beyond 20 GHz"; ICTON-2016; paper Mo.D5.3; 2016; pp. 1-4.

United States Patent and Trademark Office, Final Office Action for U.S. Appl. No. 16/404,244, dated Apr. 26, 2021, (35 pages), U.S.

Yue Shi et al.; "A Review: Preparation, performance and applications of Silicon Oxynitride Film" Micromachines 2019, 10, 552, pp. 1-23.

European Search Report from European Patent Application No. 20197767.5, dated Mar. 1, 2021, 12 pages.

Larsson: "Advances in VCSELs for Communication and Sensing", IEEE Journal of Selected Topics in Quantum Electronics, IEEE Service Center, Piscataway, NJ, US; vol. 17, No. 6, Dec. 2011 (Dec. 2011), pp. 1552-1567, XP011459291.

Haglund A et al.: "Single Fundamental-Mode Output Power Exceeding 6mW From VCSELs With a Shallow Surface Relief"; IEEE Photonic Technology Letters, IEEE Service Center, Piscataway, NJ, US; vol. 16, No. 2, Feb. 2004, pp. 368-370, XP002399792.

Finisar Advanced Optical Components Division; "Application Note; Modulating Finisar Oxide VCSELs"; 2007; 8 pages.

Levy J.L. and Mayer R.C.: "Solutions for the Laser Rate Equations for Cavity-Dumping With Pulse Position Modulation"; Mathl. Comput. Modelling, vol. 12, No. 8, pp. 919-923, 1989.

\* cited by examiner

| Etch Depth D (nm) | 0 | 25 | 40 | 55 |
|---|---|---|---|---|
| Modulation Bandwidth (GHz) | 15 | 17 | 23 | 22 |
| Photon Lifetime (ps) | 6.4 | 5.3 | 3.3 | 1.3 |

FIG. 8

HIGH SPEED HIGH BANDWIDTH VERTICAL-CAVITY SURFACE-EMITTING LASER WITH CONTROLLED OVERSHOOT

CROSS-REFERENCE TO RELATED APPLICATIONS

This application is a continuation-in-part of U.S. patent application Ser. No. 16/404,244, filed May 6, 2019, the contents of which are hereby incorporated herein in its entirety by reference.

FIELD

Embodiments of the present invention relate generally to vertical-cavity surface-emitting lasers (VCSELs). Example embodiments relate generally to high speed, high bandwidth VCSELs with controlled overshoot.

BACKGROUND

As data communication demands increase in both volume and speed, fiber optics have become an increasingly popular communication approach. One emerging element of this approach for generating the data stream communicated through fiber optics cables comprises a VCSEL optically coupled with a single mode fiber. However, traditional VCSEL designs tend to fail to provide control over photon lifetime, signal bandwidth, and overshoot for operating as a high speed, high bandwidth VCSEL.

BRIEF SUMMARY OF SOME EXAMPLE EMBODIMENTS

Example embodiments of the present invention provide a high speed, high bandwidth VCSEL. For example, various embodiments provide VCSELs capable of communicating data at rates of 50 gigabytes per second or higher. In an example embodiment, the overshoot of the VCSEL is constrained while providing a controlled photon lifetime and signal bandwidth. For example, in an example embodiment, a VCSEL may comprise an emission structure comprising a first reflector, a second reflector, and an active region sandwiched between the first and second reflectors, where the second reflector has been etched to a depth D and with an etching diameter $a_0$. In various embodiments, the etching of the second reflector maintains the high reflectivity of the second reflector while reducing the photon lifetime to support high speed data encoding via a high bandwidth signal with controlled overshoot. Thus, various example embodiments provide a high speed, high bandwidth VCSEL with controlled dumping and overshoot characteristics.

According to a first aspect of the present invention, a vertical-cavity surface-emitting laser (VCSEL) is provided. In an example embodiment, the VCSEL comprises a mesa structure disposed on a substrate. The mesa structure comprises a first reflector, a second reflector, and an active cavity material structure disposed between the first and second reflectors. The second reflector comprises an opening extending from a second surface of the second reflector into the second reflector by a predetermined depth.

In an example embodiment, the predetermined depth is within a range of approximately 20 nm to 55 nm. In an example embodiment, the predetermined depth is within a range of approximately 15 nm to 30 nm. In an example embodiment, the predetermined depth is within a range of 20 nm to 25 nm. In an example embodiment, the VCSEL further comprises a cap layer and a contact disposed on the second surface of the second reflector. In an example embodiment, (a) the contact defines an aperture diameter, (b) the opening defines an opening diameter, and (c) the aperture diameter is approximately the same as the opening diameter. In an example embodiment, the opening defines an opening diameter that is approximately the same as a second reflector diameter defined by the second reflector. In an example embodiment, the photon lifetime of the VCSEL is in a range of approximately 5.5 ps and 1 ps. In an example embodiment, the opening is formed through etching. In an example embodiment, the modulation bandwidth of the VCSEL is 17 GHz or greater. In an example embodiment, at least one of the first and second reflectors comprises a semiconductor distributed Bragg reflector (DBR).

According to another aspect of the present invention, a method for manufacturing a vertical-cavity surface-emitting laser (VCSEL) is provided. In an example embodiment, the method comprises dry etching a VCSEL blank to define a mesa structure; wet etching the mesa structure to define an emission structure, the emission structure comprising a first reflector, a second reflector, and an active region sandwiched between the first reflector and the second reflector; and etching an opening into the second reflector, the opening extending from a second surface of the second reflector into the second reflector a predetermined depth.

In an example embodiment, the method further comprises depositing a dielectric cap layer on the second surface of the second reflector. In an example embodiment, the dielectric cap layer is deposited before the opening is etched into the second reflector. In an example embodiment, the dielectric cap layer is deposited after the opening is etched in the second reflector. In an example embodiment, the method further comprises depositing a contact on the dielectric cap layer. In an example embodiment, (a) the contact defines an aperture diameter, (b) the opening defines an opening diameter, and (c) the aperture diameter is approximately the same as the opening diameter.

In an example embodiment, the predetermined depth is within a range of approximately 20 nm to 55 nm. In an example embodiment, the predetermined depth is within a range of approximately 15 nm to 30 nm. In an example embodiment, the predetermined depth is within a range of 20 nm to 25 nm. In an example embodiment, the opening is etched into the second reflector using wet etching.

According to yet another aspect of the present invention, a method for manufacturing a vertical-cavity surface-emitting laser (VCSEL) is provided. In an example embodiment, the method comprises dry etching a VCSEL blank to define a mesa structure; and wet etching the mesa structure to define an emission structure, the emission structure comprising a first reflector, a second reflector, and an active region sandwiched between the first reflector and the second reflector. The second reflector comprises an opening extending from a second surface of the second reflector into the second reflector by a predetermined depth.

BRIEF DESCRIPTION OF THE DRAWING(S)

Having thus described the invention in general terms, reference will now be made to the accompanying drawings, which are not necessarily drawn to scale, and wherein:

DETAILED DESCRIPTION OF SOME EXAMPLE EMBODIMENTS

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the top or on the bottom, depending on the orientation of the particular item being described. As used herein, the term "approximately" refers to tolerances within manufacturing and/or engineering standards.

Example VCSEL

Figure 1A:
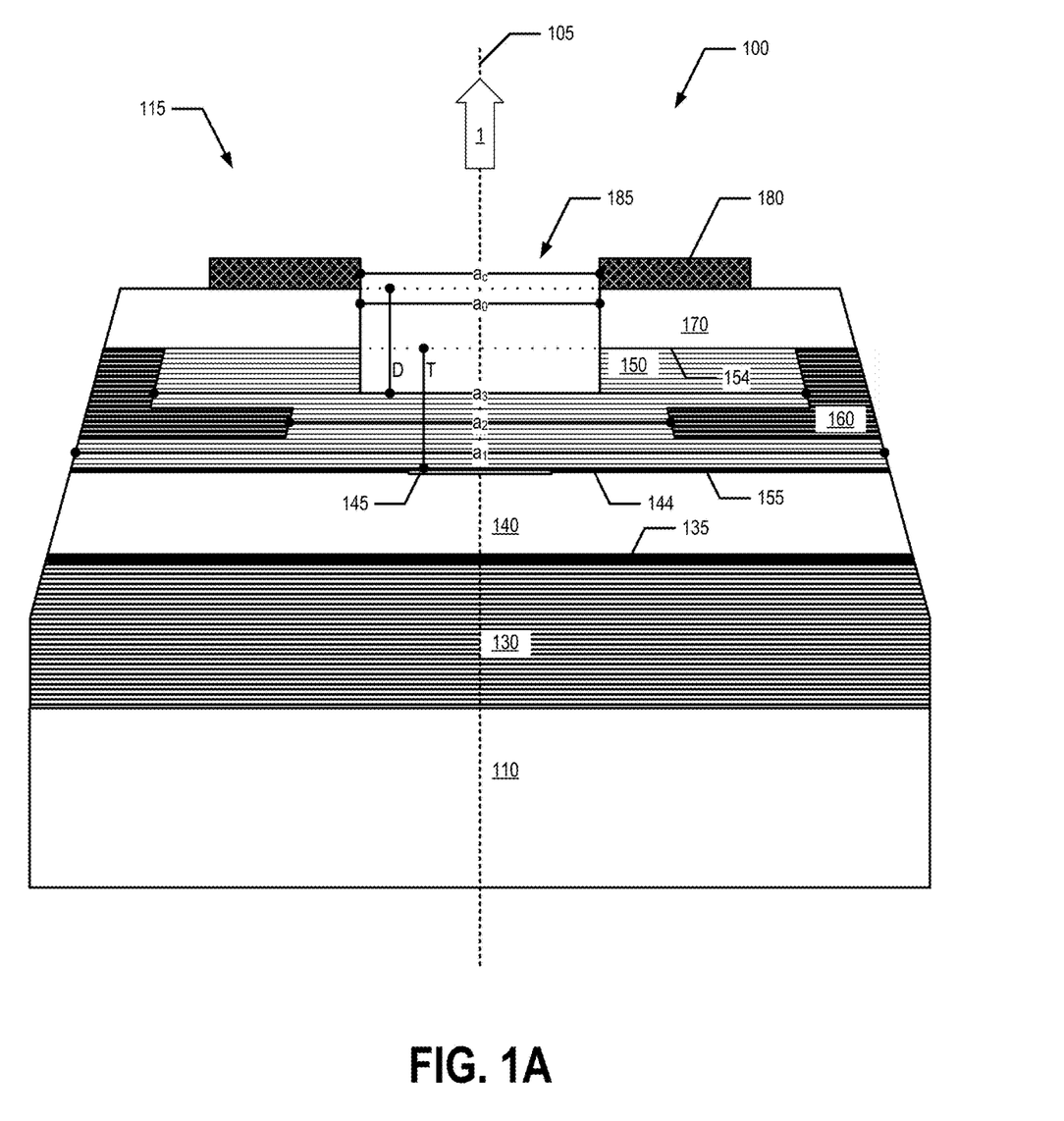
FIG. 1A illustrates a schematic cross-section of a VCSEL, according to an example embodiment.
Figure 1B:
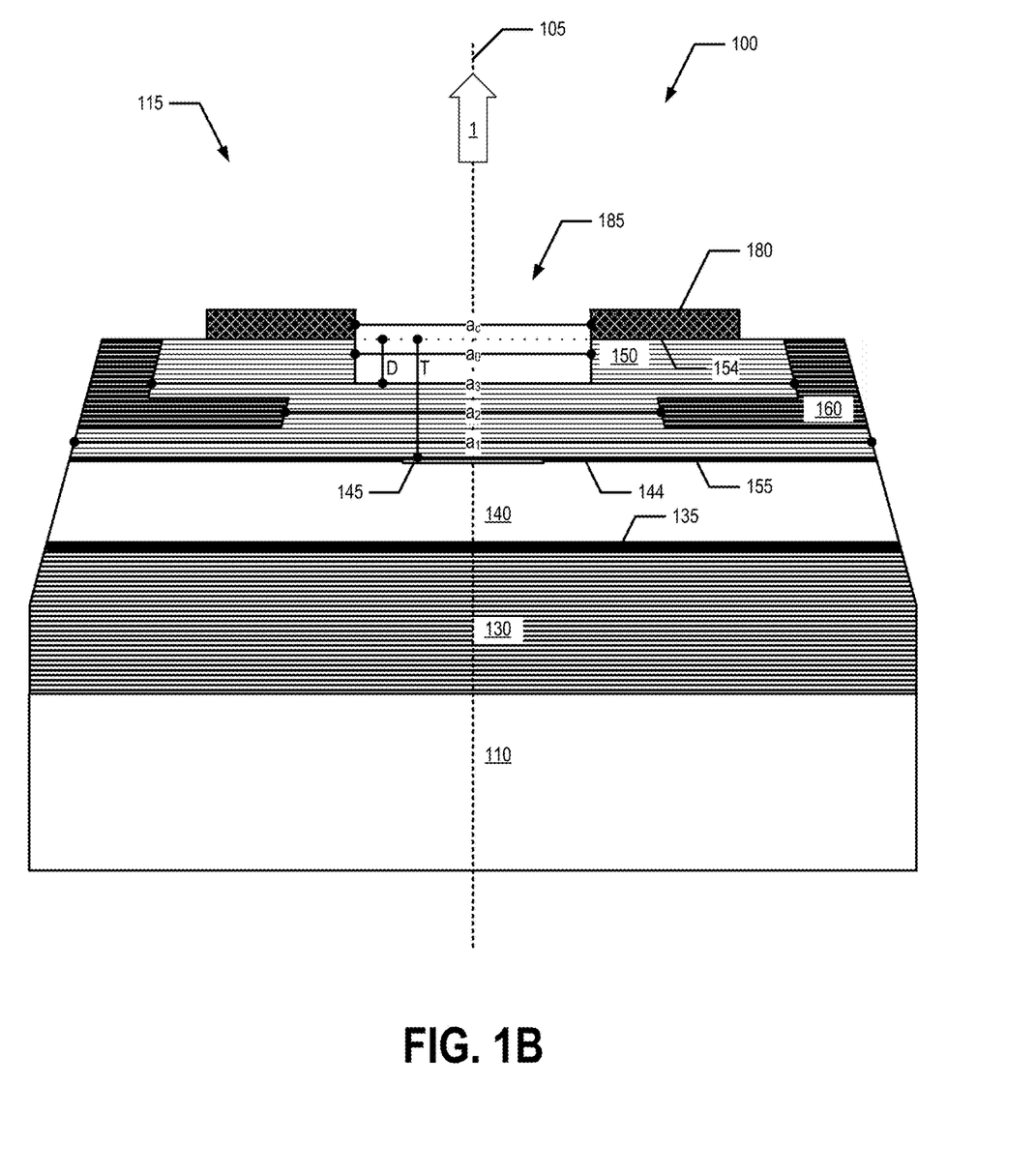
FIG. 1B illustrates a schematic cross-section of a VCSEL, according to another example embodiment.

FIG. 1A illustrates a cross section view of a portion of an example embodiment of a vertical-cavity surface-emitting laser (VCSEL) 100. The VCSEL 100, comprises a substrate 110, an emission structure, and a cap layer 170. In an example embodiment, a thin buffer layer (e.g., an approximately 0.5 to 1.5 µm thick n-type layer) may be deposited and/or disposed between the substrate 110 and the emission structure. In an example embodiment, the emission structure comprises a first reflector 130, a second reflector 150, and an active cavity material structure sandwiched between the first and second reflectors 130, 150. In an example embodiment, the first reflector 130 is deposited and/or disposed directly on the substrate 110 and/or the thin buffer layer. In an example embodiment, the emission structure forms and/or is part of a mesa structure 115. In an example embodiment, the active cavity material structure comprises a first current-spreading layer 135, an active region 140, and a second current-spreading layer 155. In an example embodiment, the active cavity material structure further comprises a tunnel junction 145 over grown in the second current-spreading layer 155. FIG. 1B illustrates another example embodiment of a VCSEL 100 that does not comprise a cap layer 170.

In an example embodiment, the VCSEL 100 further comprises contacts (e.g., comprising trace(s) and/or pad(s) for connecting an electrical source to the VCSEL 100) that is electrically connected to the emission structure (e.g., the first and second current-spreading layers 135, 155). For example, the VCSEL 100 comprises a second contact 180 disposed adjacent to, mounted to, secured to, and/or abutting the cap layer 170 and extending away from the emission structure to provide trace(s) and pad(s) for connecting an electrical source to the VCSEL 100. In an example embodiment, the second contact 180 is in electrical communication with the second current-spreading layer 155 and a first contact (e.g., disposed adjacent to the mesa structure 115, in another mesa structure, and/or the like) is in electrical communication with the first current-spreading layer 135. For example, the first and second contacts 180 may comprise an anode contact and a cathode contact. In various embodiments, the contacts 180 are configured to have leads secured thereto such that the VCSEL 100 may be operated by applying voltage, current, an electrical signal and/or the like to the VCSEL 100 via the leads. In various embodiments, the first and second current-spreading layers 135, 155 are configured to provide electrical signals, current, voltage, and/or the like applied to the contacts 180 to the active region 140. In various embodiments, the first and/or second contacts 180 may be made of gold or another conductive material.

In an example embodiment, the substrate 110 provides a base layer upon which the VCSEL is built, mounted, secured, and/or the like. In an example embodiment, the substrate 110 is a semi-insulating gallium arsenide (GaAs) substrate. In various embodiments, the substrate 110 is a GaAs substrate doped with silicon (Si) or various other elements. In an example embodiment, the substrate 110 is a Si substrate, or other appropriate substrate. In an example embodiment, the substrate 110 may be in the range of 50 to 300 µm thick. For example, the substrate 110 may be approximately 150 µm thick, in an example embodiment. In an example embodiment, the substrate 110 is at least a portion of a wafer.

In various embodiments, the emission structure of the VCSEL 100 comprises a first reflector 130, a first current-spreading layer 135, an active region 140, a second current-spreading layer 155, and a second reflector 150. The first reflector 130 may be adjacent, secured, mounted to and/or abutting the substrate 110 and/or the thin buffer layer. The first current-spreading layer 135 may be a current spreading and/or conductive layer sandwiched between the first reflector 130 and the active region 140. For example, the first current-spreading layer 135 may be adjacent, secured, mounted to and/or abutting the first reflector 130 and the active region 140. The second current-spreading layer 155 may be a current spreading and/or conductive layer sandwiched between the active region 140 and the second reflector 150. For example, the second current-spreading layer 155 may be adjacent, secured, mounted to and/or abutting the active region 140 and the second reflector 150.

In various embodiments, the first and second reflectors 130, 150 are configured to couple and/or reflect laser light generated by the active region 140 such that the laser light 1 may be emitted through the aperture of aperture diameter $a_c$ in the contact 180 in a direction along the emission axis 105. In various embodiments, each of the first and second reflectors 130, 150 comprises a semiconductor distributed Bragg reflector (DBR), dielectric reflector stacks, and/or the like. For example, the first and second reflectors 130, 150 may comprise un-doped alternating layers of aluminum gallium arsenide (AlGaAs) and gallium arsenide (GaAs). In various embodiments, each of the first and second reflectors 130, 150 may comprise a plurality of layers of AlGaAs and GaAs. For example, each of the first and second reflectors 130, 150 may comprise between 15 and 35 pairs of layers of GaAs/AlGaAs. For example, in an example embodiment, each of the first and second reflectors may comprise 25 pairs of layers of GaAs/AlGaAs. For example, each of the first and second reflectors may comprise 25 layers of GaAs and 25 layers of AlGaAs wherein the layers are disposed such that the layers alternate between a GaAs layer and an AlGaAs layer. For example, a pair of layers may consist of a GaAs layer and an abutting AlGaAs layer. In an example embodiment, the thickness of each layer is approximately one-fourth $\lambda/n$, where $\lambda$ is the emission wavelength and n is the refractive index of the semiconductor of that layer. In an example embodiment, at least one layer of the first reflector 130 is doped such that the first reflector comprises an n-type DBR (N-DBR). In an example embodiment, at least one layer of the second reflector 150 is doped such that the second reflector comprises a p-type DBR (P-DBR).

In an example embodiment, the second reflector 150 has a reflector thickness T. In an example embodiment, the reflector thickness T is in the range of 1.5 to 3 µm. In an example embodiment, the reflector thickness T is in the range 2 to 2.5 µm. In an example embodiment, the reflector thickness T is approximately 2.25 µm. As described above, the reflector thickness T of the second reflector 150 may be determined based on the refractive indexes of the layers of the second reflector 150 and the wavelength of the laser light 1.

As described above, a first current-spreading layer 135 may be sandwiched between the first reflector 130 and the active region 140, and a second current-spreading layer 155 may be sandwiched between the active region 140 and the second reflector 150. In various embodiments, the first and second current-spreading layers 135, 155 comprise n-type indium phosphide (n-InP) layers. In various embodiments, the first and/or second current-spreading layer 135, 155 comprises an indium gallium arsenide phosphide (InGaAsP) layer. In various embodiments, providing the electrical contact through n-type first and second current-spreading layers 135, 155 allows for each of the first and second reflectors 135, 155 to comprise un-doped DBR mirrors or dielectric reflector stacks, as described elsewhere herein.

In various embodiments, the active region 140 comprises a tunnel junction 145 that is embedded and/or disposed within the second current-spreading layer 155. For example, the tunnel junction 145 may be overgrown by the second current spreading layer 155, wherein the tunnel junction 145 is disposed adjacent and/or abutting the active region 140. In an example embodiment, the tunnel junction 145 is a mesa etched in the $p^{++}/n^{++}$ tunnel junction. In an example embodiment, the tunnel junction 145 comprises a heavily doped p++/n++ indium aluminum gallium arsenide tunnel junction. In various embodiments, a reverse biased p-n junction blocks the current around the tunnel junction 145 when a direct voltage is applied to the VCSEL 100 (e.g., via the contacts 180). In various embodiments, the tunnel junction 145 serves a dual role of optical (photon) and electrical (current) confinement. The tunnel junction 145 may, for example, be embedded in an overgrown region which provides both current and photon confinement. In this example, the current is confined by the reverse p-n junction that is formed at the interface between the second current-spreading layer 155 and a p-layer comprising a second surface 144 of the active region 140. In an example embodiment, optical confinement is defined by the tunnel junction 145 representing an optical aperture for emitting laser light 1 and is determined by the width or diameter of the tunnel junction 145 (e.g., the tunnel junction diameter $D_{TJ}$) in a plane perpendicular to the emission axis 105.

In various embodiments, the active region 140 is sandwiched and/or disposed between the first and second current-spreading layers 135, 155. In various embodiments, the active region 140 is in electrical communication with the first and second current-spreading layers 135, 155. In various embodiments, the active region 140 comprises a plurality of quantum wells, where light and/or electromagnetic radiation 1 is generated, between the first and second reflectors 130, 150. In various embodiments, the active region 140 may comprise a multi-quantum well (MQW) layer stack comprising a series of quantum wells disposed between a series of barriers, a p-type region (layer) disposed between the second current-spreading layer 155 and the MQW layer stack. For example, a second surface 144 of the active region 140 may comprise a p-type layer. In an example embodiment, the series of quantum wells and barriers may comprise six un-doped compressively strained, indium aluminum gallium arsenide (InAlGaAs) quantum wells and seven tensile strained InAlGaAs barriers.

In an example embodiment, the second reflector 150 is partially oxidized and/or comprises one or more oxidized elements 160 that define an oxidation profile. In various embodiments, the oxidation profile defines one or more oxidation profile diameters (e.g., $a_2$, $a_3$). In various embodiments, the oxidation profile diameters (e.g., $a_2$, $a_3$) are defined in planes that are perpendicular to the emission axis 105. In various embodiments, a second contact 180 may be disposed on the cap layer 170. In an example embodiment, the second contact 180 defines an aperture 185 through which the VCSEL 100 may emit laser light 1. In various embodiments, an interior diameter of the second contact 180 defines a physical emission aperture of the VCSEL 100. The physical emission aperture has an aperture diameter $a_c$, as shown in FIGS. 1A and 1B. For example, the laser light 1 emitted by the VCSEL 100 may be emitted along an emission axis 105 defined by the emission structure of the VCSEL 100 and through an aperture having an aperture diameter $a_c$ provided through the second contact 180. The aperture diameter $a_c$ may be measured in a plane that is perpendicular to the emission axis 105.

In an example embodiment, a cap layer 170 is deposited and/or disposed on the emission structure. The cap layer 170 may be an insulating layer made of and/or comprising $SiO_2$, $Si_3N_4$, benzo-cyclo-butene (BCB), GaAs, and/or the like, for example. In an example embodiment, the cap layer 170 is approximately 40 nm thick. In an example embodiment, the cap layer 170 is approximately 38.2 nm thick.

In various embodiments, the second reflector 150 may be etched such that at least a portion of the second reflector 150 has a thickness that is smaller than the reflector thickness T. In an example embodiment, the etching passes through the cap layer 170 and through a portion of the second reflector 150 to a depth D. In an example embodiment, the etching of the second reflector 150 is performed prior to the deposition of the cap layer 170, and the cap layer 170 may be deposited on the etched surface of the second reflector 150. As shown in FIGS. 1A and 1B, the second reflector 150 may have a thickness of reflector thickness T and, as shown by the dotted line indicating the pre-etching second edge 154 of the second reflector 150, the second reflector 150 may be etched to a depth D to create the opening 185. As shown in FIGS. 1A and 1B, the etching depth D may be measured from pre-etched second surface of the VCSEL 100. In an example embodiment, the second contact 180 is disposed on the pre-etched second surface of the VCSEL 100. In various embodiments, the pre-etched second surface of the VCSEL 100 is the second edge of the cap layer 170, in embodiments having a cap layer 170, or from the pre-etching second edge 154 of the second reflector 150, in embodiments not having a cap layer 170. The depth D may be measured parallel to the emission axis 105. In an example embodiment, the depth D is in the range of approximately 20 to 55 nm. In an example embodiment, the depth D is approximately 40 nm. In an example embodiment, the depth D is in the range of approximately 15 to 30 nm. In an example embodiment, the predetermined depth is within a range of 20 nm to 25 nm.

The diameter of the opening 185 (e.g., opening diameter $a_O$) may be measured in a plane perpendicular to the emission axis 105. In an example embodiment, the opening diameter $a_O$ is approximately the same as the aperture diameter $a_c$. In an example embodiment, the opening diameter $a_O$ may be smaller than the aperture diameter $a_c$. In an example embodiment, the opening diameter $a_O$ is in the range of half the diameter of the mesa $a_1/2$ to the diameter of the mesa $a_1$. In an example embodiment, the opening diameter $a_O$ is in the range of 10-30 nm. For example, in some example embodiments, the opening diameter is $a_O$ is 15 nm, 20 nm, or 25 nm. In an example embodiment, the opening diameter $a_O$ is greater than the aperture diameter $a_c$. For example, the opening diameter $a_O$ may be approximately the same as one of the oxidation profile diameters (e.g., $a_2$, $a_3$) or may be another diameter between the aperture diameter and the second reflector diameter $a_1$. The opening diameter $a_O$ may be no larger than the second reflector diameter $a_1$. The second reflector diameter $a_1$ may be measured in a plane perpendicular to the emission axis 105 and, in an example embodiment, is in the range of 10 to 50 μm. For example, in an example embodiment, the second reflector diameter $a_1$ is approximately 27 μm. In various embodiments, the second reflector diameter $a_1$ is approximately the same in any plane taken perpendicular to the emission axis 105 within the second reflector 150. In an example embodiment, the second reflector diameter $a_1$ may be smaller in a plane taken perpendicular to the emission axis 105 near the second surface 154 of the second reflector 150 than in a plane taken perpendicular to the emission axis 105 near the second current-spreading layer 155. For example, in an example embodiment, the mesa structure 115 may be tapered.

Figure 2:
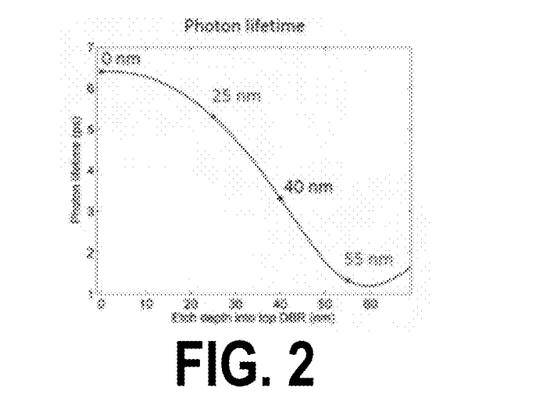
FIG. 2 is a graph showing simulation results of the effect of the depth D on the photon lifetime, according to another example embodiment.
Figure 3:
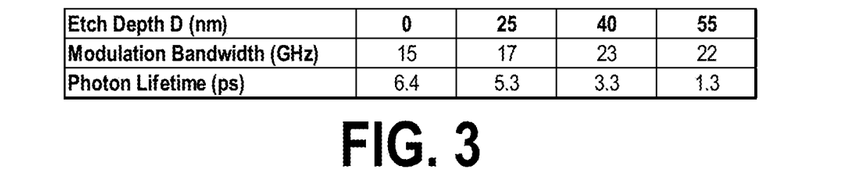
FIG. 3 provides a table summarizing various simulation results, according to an example embodiment.

FIG. 2 shows the effect of the depth D on the photon lifetime of the VCSEL 100 and the threshold gain of the VCSEL 100, according to simulation results. FIG. 3 provides a table summarizing the modulation bandwidth in GHz and the photon lifetime in picoseconds (ps) for etch depths D of 0 nm (e.g., without etching), 20 nm, 40 nm, and 55 nm. As can be seen from FIGS. 2 and 3, etching the second reflector 150 to a depth D reduces the photon lifetime and the threshold gain of the VCSEL 100, while increasing the modulation bandwidth and maintaining the high reflectivity of the second reflector 150. For example, the etching of the second reflector 150 to a depth D allows for increased control of the cavity dumping response of the VCSEL 100. Thus, etching the second reflector 150 to a depth D provides an improvement in overshoot control, broader modulation bandwidth, and faster pulsing of the VCSEL 100 such that the VCSEL 100 may provide a high speed, high bandwidth signal with controlled overshoot.

Figure 4:
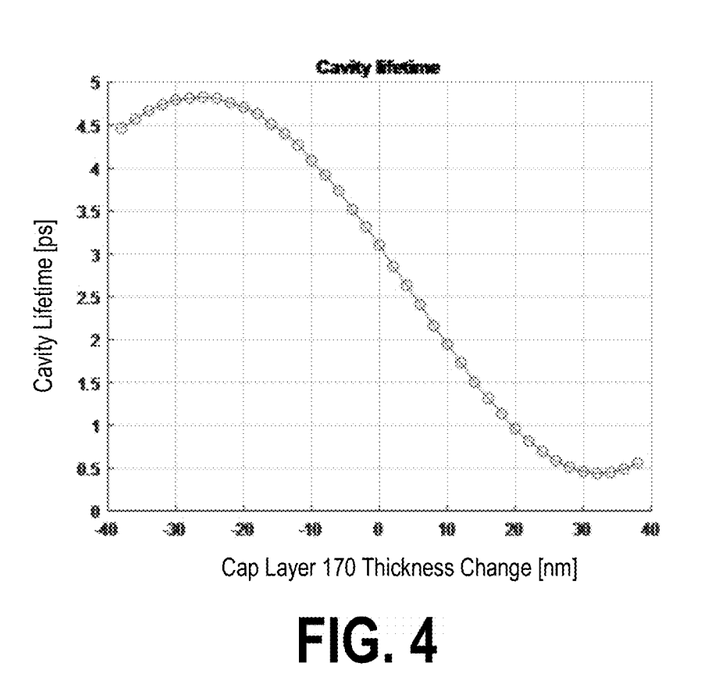
FIGS. 4, 5, 6, 7A, and 7B provide plots illustrating various properties of example simulated embodiments.
Figure 5:
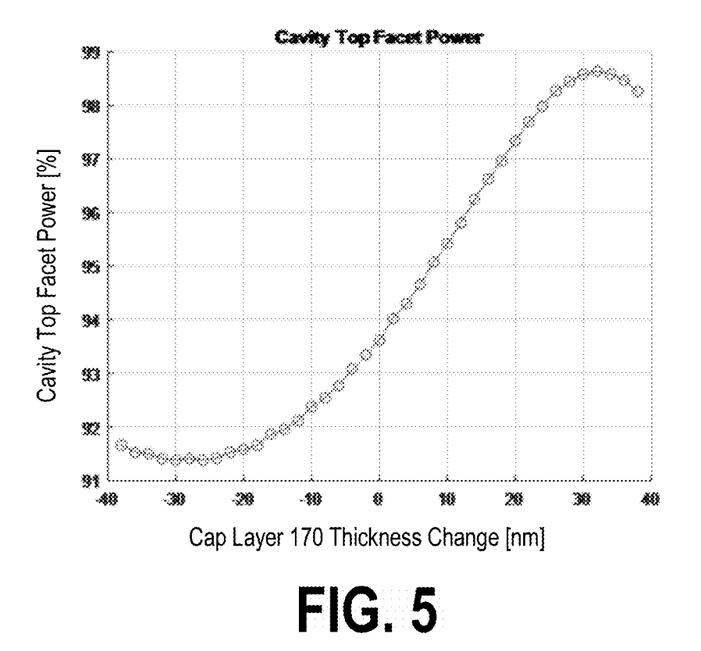
Figure 6:
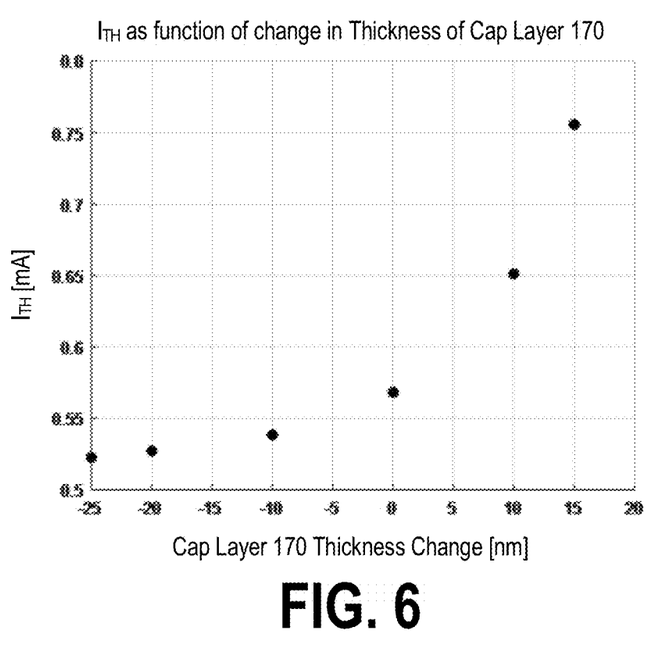
Figure 7A:
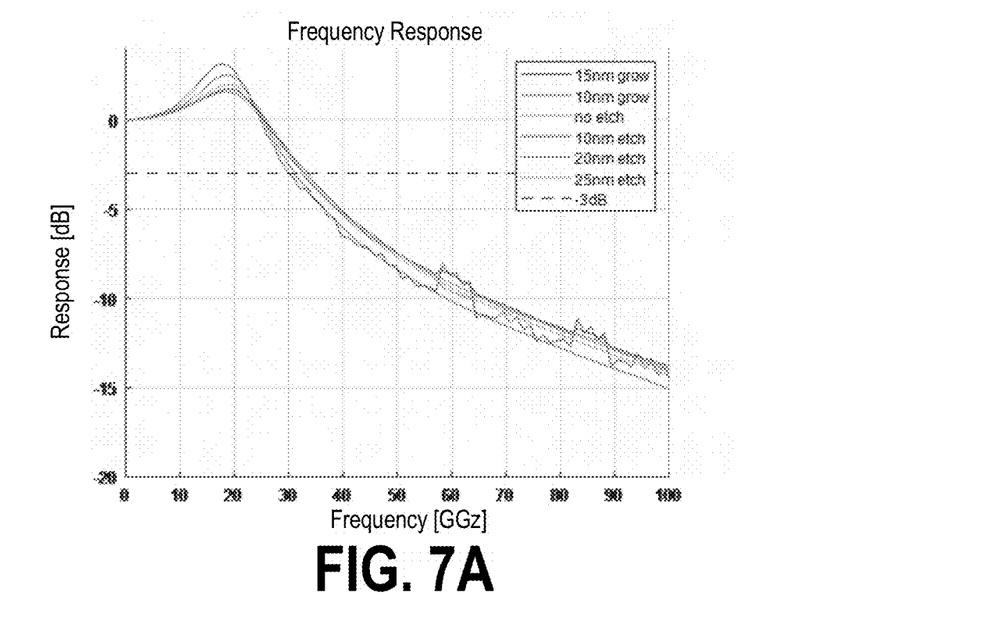
Figure 7B:
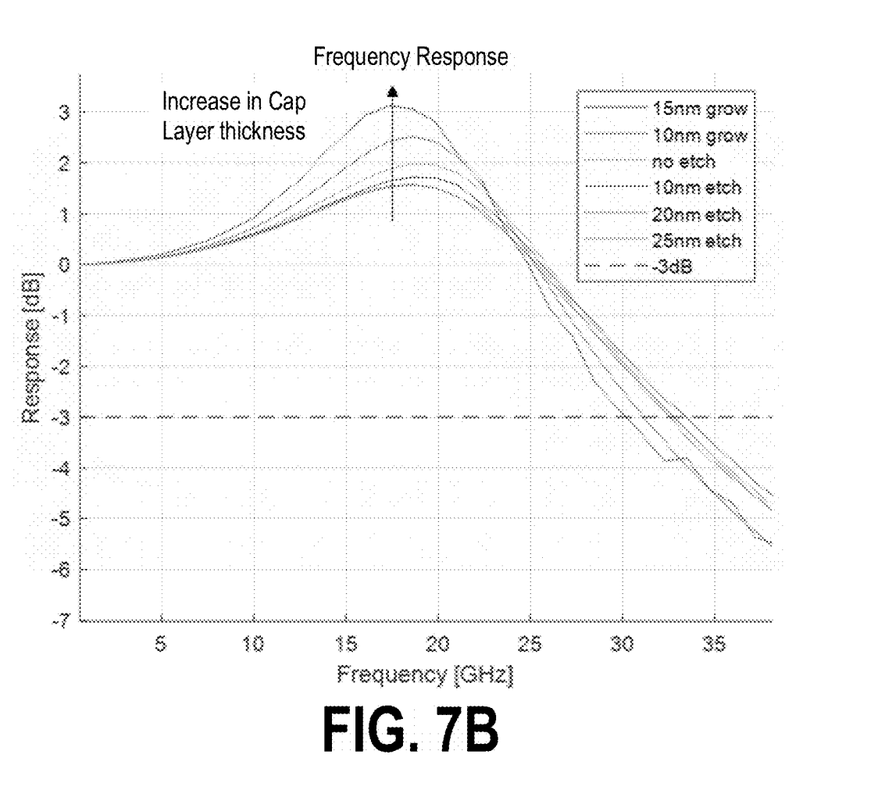

FIGS. 4, 5, 6, 7A, and 7B provides plots illustrating various features of some example simulated embodiments of VCSELs 100. FIGS. 4 and 5, show simulation results of the photon lifetime and top facet power for the VCSEL 100 as a function of the thickness change of the cap layer 170. For example, in the plots shown in FIGS. 4 and 5, -10 along the horizontal axis refers to etching the top layer 170 to a depth D of 10 nm and 10 along the horizontal axis refers to growing the top layer 170 to a thickness of 10 nm larger, with 0 being the traditional cap layer 170 thickness of approximately 38.2 nm in the simulated embodiments. As shown in FIGS. 4 and 5, for the simulated embodiment, the cavity lifetime reached a maximum of 4.8 ps for an etch depth D of 25 nm and a minimum of 0.44 ps for 30 nm grow (e.g., growing the cap layer 170 thicker, for example, using epitaxial growth of the cap layer 170). The top facet output power is maximum when the lifetime reaches a minimum value (e.g., for 30 nm grow, in the simulated embodiment). The current-power curves of the simulated embodiments agree with the cavity output power calculation: in the range 25 nm etch to 15 nm grow, the thicker the cap layer 170 the higher the optical power. The current-voltage curves of the simulated embodiments show that the depth D has very little effect on the current-voltage relationship for the VCSEL 100. FIG. 6 shows the threshold current $I_{TH}$ of the simulated embodiments of the VCSEL 100 as a function of the etch/growth of the cap layer 170. In general, FIG. 6 shows that the threshold current varies with the cap layer 170 thickness and the cavity lifetime: the higher the cavity lifetime, the lower the threshold. For example, in a simulated embodiment with the cap layer 170 etched to a depth D of 25 nm, the cavity lifetime is increased by 1.7 ps over the simulated embodiment where the cap layer 170 is etched to a depth D of 0 and the threshold current $I_{TH}$ is approximately 0.05 mA in the simulated embodiment with D of 25 nm compared to the simulated embodiment with D of 0. FIGS. 7A and 7B show the frequency response curve for various simulated example embodiments of the VCSEL 100 calculated at a current of 7.5 mA. As shown in FIGS. 7A and 7B, decreasing the cap layer 170 thickness (e.g., increasing the depth D) results in less overshoot and a slightly higher -3 dB frequency. The simulated example embodiments having cap layers 170 etched to depths D of 20 nm and 25 nm show similar frequency responses and are similar in terms of cavity properties.

Example Method for Manufacturing a VCSEL

Figure 8:
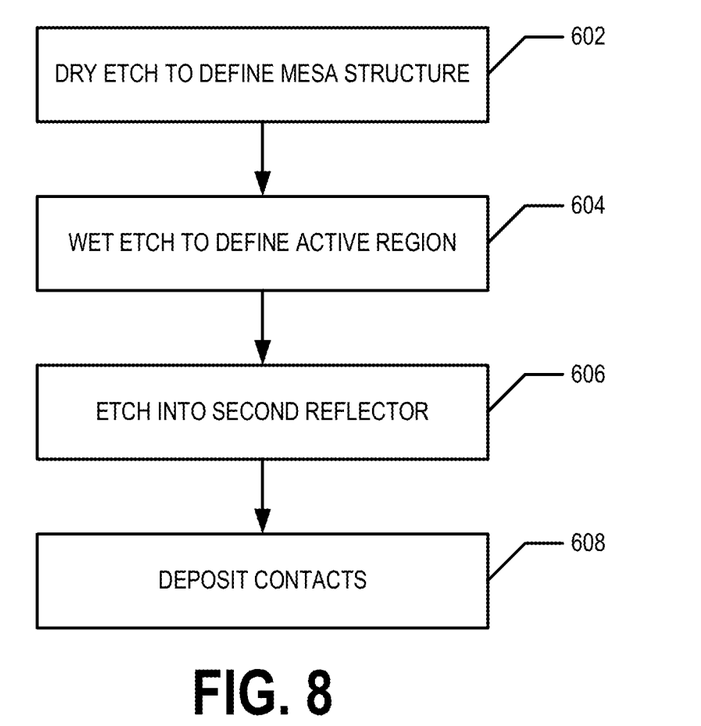
FIG. 8 provides a flowchart illustrating various processes, procedures, and/or operations for manufacturing a VCSEL, according to an example embodiment.

FIG. 8 provides a flowchart illustrating an example process for manufacturing a VCSEL 100. Starting at block 602, a VCSEL blank comprising a plurality of layers may be dry-etched to define one or more mesas (e.g., mesa structure 115). For example, the VCSEL blank may be formed on the substrate 110 (and/or thin buffer layer) and may comprise a first layer from which a first reflector 130 may be formed, a second layer from which a first current-spreading layer 135 may be formed, a third layer from which an active region 140 may be formed, a fourth layer from which a second current-spreading layer 155 may be formed, a fifth layer from which a second reflector 150 may be formed, and/or the like. In an example embodiment, the VCSEL blank comprises a sixth layer from which a cap layer 170 may be formed. For example, the first and fifth layers may comprise a plurality of un-doped alternating layers of AlGaAs and GaAs for forming DBR mirrors of the first and second reflectors 130, 150. In an example embodiment, the second and fourth layers comprise a conductive material from which the first and second current-spreading layers 135, 155 may be formed. In an example embodiment, the fourth layer of the VCSEL blank may have a tunnel junction 145 embedded, disposed, and/or grown therein. For example, the third layer may comprise a multi-quantum well (MQW) layer stack comprising a series of quantum wells disposed between a series of barriers. In an example embodiment, the third layer comprises a p-type region (layer) disposed between the MQW layer stack and the fourth layer of the VCSEL blank.

The VCSEL blank may be dry etched to form and/or define one or more mesas (e.g., mesa structure 115). In an example embodiment, the VCSEL blank is dry etched in Ar—SiCl$_4$ plasma. In an example embodiment, the VCSEL blank is dry etched using a photoresist or dielectric mask. In an example embodiment, the center of the masked region is aligned with the center of the tunnel junction 145. In an example embodiment, the dry etching is used to define the second reflector 150. In an example embodiment, the dry-etching is ceased when the second layer (e.g., the layer from which the first current-spreading layer may be formed) is exposed.

Continuing with FIG. 4, at block 604 wet etching is used to define and/or form the active region 140 and second reflector 150. For example, in an example embodiment, the wet etching is done by selective chemical etching in H3PO4—H2O2—H2O solutions until reaching the first current-spreading layer 135. For example, the mesa structure 115 may be wet etched to define and/or to finish defining the emission structure. For example, the first reflector 130 may have a diameter that is larger than the remainder of the mesa structure 115, and the first current-spreading layer 135 may have a diameter that is approximately the same size as the first reflector 130 or smaller and that is larger than the remainder of the mesa structure 115. For example, the diameter of the first current-spreading layer 135 may be configured to allow for electrical contacts to be generated between the first current-spreading layer 135 and first contacts configured to provide an electrical signal to the first current-spreading layer 135. At block 606, wet etching may be used to define and/or form the second reflector 150.

At block 606, wet etching may be used to define and/or form the opening 185. For example, the sixth and fifth layers may be etched (e.g., by selective chemical etching in H3PO4—H2O2—H2O solutions) until the depth D within the second reflector 150 is reached. The etching is performed such that the opening 185 has a diameter of the opening diameter $a_0$. In various embodiments, the depth D and the opening diameter $a_0$ are predetermined (e.g., determined prior to the etching of the opening 185). For example, the sixth and fifth layers may be etched to a depth D of approximately 20-25 nm, in various embodiments.

At block 608, the second contacts 180 may be deposited and/or formed on the cap layer 170. For example, various metal deposition techniques may be used to deposit the second contacts 180 on the cap layer 170. In an example embodiment, the second contacts are deposited around the opening 185. In an example embodiment, the second contacts 180 are deposited and/or formed such that the second contacts 180 are in directed electrical communication with the second current-spreading layer 155.

In various embodiments, dielectric may be deposited between blocks 604 and 606 or between blocks 606 and 608. For example, if the VCSEL blank does not comprise a layer that may be formed into a cap layer 170, a dielectric may be deposited to form the cap layer 170. For example, chemical vapor deposition may be used to deposit the dielectric material to form the cap layer 170. In an example embodiment, the dielectric material is SiO$_2$, Si$_3$N$_4$, benzo-cyclobutene (BCB), and/or the like. The dielectric material may electrically and chemically passivate all of the interfaces that were exposed during previous processing steps.

As should be understood, once a VCSEL 100 has been formed, manufactured, and/or the like, the VCSEL may be secured, affixed, or mounted to a circuit board. For example, a VCSEL 100 may be secured, affixed, or mounted to a circuit board such that the first contact is mechanically secured to a first lead such that the first contact is in electrical communication with the first lead. For example, a VCSEL 100 may be secured, affixed, or mounted to a circuit board such that the second contact 180 is mechanically secured to a second lead such that the second contact 180 is in electrical communication with the second lead. Mounting a VCSEL 100 to a circuit board may therefore manufacture, generate, form, and/or otherwise result in a board-mounted VCSEL.

In an example embodiment, the depth D and opening diameter $a_0$ may be taken into account when designing and manufacturing the VCSEL blank. For example, the VCSEL blank may be formed such that the layer from which the second reflector is to be formed comprises an opening 185 of the desired (e.g., predetermined) depth D and opening diameter $a_0$. This strategy of forming the opening 185 may be particularly efficient for embodiments in which the opening diameter $a_0$ is approximately the same as the second reflector diameter $a_1$.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A vertical-cavity surface-emitting laser (VCSEL) comprising:
   a mesa structure disposed on a substrate, the mesa structure comprising:
   a first reflector having a first depth in a direction substantially parallel to an emission direction of the VCSEL,
   a second reflector having a second depth in the direction substantially parallel to the emission direction of the VCSEL and having an oxidation profile defining one or more oxidation profile diameters,
   an active cavity material structure disposed between the first and second reflectors,
   a dielectric cap layer disposed on a surface of the second reflector opposite the active cavity material, and
   a contact disposed on the dielectric cap layer and defining an emission aperture of the VCSEL characterized by an emission aperture diameter,
   wherein the dielectric cap layer and the second reflector comprise an opening extending therethrough from a pre-etched second surface of the VCSEL through the dielectric cap layer and into the second reflector in the direction substantially parallel to the emission direction of the VCSEL,
   wherein the opening extends into the second reflector a depth that is less than the second depth,
   wherein the opening extending through the dielectric cap layer and the second reflector is characterized by an opening diameter,
   wherein the opening diameter is substantially the same size or larger than the emission aperture diameter, and
   wherein the opening diameter is smaller than a smallest one of the one or more oxidation profile diameters.

2. The VCSEL of claim 1, wherein the depth of the opening is within a range of approximately 20 nm to 55 nm.

3. The VCSEL of claim 1, wherein the depth of the opening is within a range of approximately 15 nm to 25 nm.

4. The VCSEL of claim 1, wherein the dielectric cap layer comprises at least one of $SiO_2$, $Si_3N_4$, or benzo-cyclo-butene (BCB).

5. The VCSEL of claim 1, wherein the opening diameter is substantially the same as a second reflector diameter defined by the second reflector.

6. The VCSEL of claim 1, wherein the photon lifetime of the VCSEL is in a range of approximately 5.5 ps and 1 ps.

7. The VCSEL of claim 1, wherein the opening is formed through etching.

8. The VCSEL of claim 1, wherein the modulation bandwidth of the VCSEL is 17 GHz or greater.

9. The VCSEL of claim 1, wherein at least one of the first and second reflectors comprises a semiconductor distributed Bragg reflector (DBR).

10. The VCSEL of claim 1, wherein the depth of the opening is measured from a surface of the dielectric cap layer proximate the contact.

11. A method for manufacturing a vertical-cavity surface-emitting laser (VCSEL), the method comprising:
    dry etching a VCSEL blank to define a mesa structure;
    wet etching the mesa structure to define an emission structure, the emission structure comprising:
        a first reflector having a first depth in a direction substantially parallel to an emission direction of the VCSEL,
        a second reflector having a second depth in the direction substantially parallel to the emission direction of the VCSEL and having an oxidation profile defining one or more oxidation profile diameters,
        an active region disposed between the first reflector and the second reflector, and
        a dielectric cap layer disposed on a surface of the second reflector opposite the active cavity material; and
    etching an opening through the dielectric cap layer and into the second reflector, the opening extending from a pre-etched second surface of the VCSEL through the dielectric cap layer and into the second reflector in the direction substantially parallel to the emission direction of the VCSEL,
    wherein the opening extends into the second reflector a depth that is less than the second depth,
    wherein the opening extending through the dielectric cap layer and the second reflector is characterized by an opening diameter,
    wherein the mesa structure further comprises a contact defining an emission aperture of the VCSEL that is characterized by an emission aperture diameter, and
    wherein the opening diameter is substantially the same size or larger than the emission aperture diameter, and
    wherein the opening diameter is smaller than a smallest one of the one or more oxidation profile diameters.

12. The method of claim 11, further comprising depositing the dielectric cap layer on the second surface of the second reflector prior to dry etching the VCSEL blank to define the mesa structure or prior to wet etching the mesa structure to define the emission structure.

13. The method of claim 11, further comprising depositing the contact on the dielectric cap layer.

14. The method of claim 11, wherein the depth of the opening is within a range of approximately 20 nm to 55 nm.

15. The method of claim 11, wherein the depth of the opening is within a range of approximately 15 nm to 25 nm.

16. The method of claim 11, wherein the opening is etched into the second reflector using wet etching.

17. The method of claim 11, further comprising forming the oxidation profile by at least partially oxidizing at least a portion of the second reflector.

18. A method for manufacturing a vertical-cavity surface-emitting laser (VCSEL), the method comprising:
    dry etching a VCSEL blank to define a mesa structure; and
    wet etching the mesa structure to define an emission structure, the emission structure comprising:
        a first reflector,
        a second reflector having an oxidation profile defining one or more oxidation profile diameters,
        an active region disposed between the first reflector and the second reflector, and
        a dielectric cap layer disposed on a surface of the second reflector opposite the active cavity material,
    wherein the second reflector has a second depth in a direction substantially parallel to an emission direction of the VCSEL,
    wherein the dielectric cap layer and the second reflector comprise an opening extending therethrough from a pre-etched second surface of the VCSEL through the dielectric cap layer and into the second reflector in the direction substantially parallel to the emission direction of the VCSEL,
    wherein the opening extends into the second reflector a depth that is less than the second depth,
    wherein the opening extending through the dielectric cap layer and the second reflector is characterized by an opening diameter,
    wherein the mesa structure further comprises a contact defining an emission aperture of the VCSEL that is characterized by an emission aperture diameter, and
    wherein the opening diameter is substantially the same size or larger than the emission aperture diameter, and
    wherein the opening diameter is smaller than a smallest one of the one or more oxidation profile diameters.

19. The method of claim 18, wherein the dielectric cap layer is deposited before the opening is etched into the second reflector.

20. The method of claim 18, wherein the dielectric cap layer is deposited after the opening is etched into the second reflector.

* * * * *